United States Patent [19]

Andersen et al.

[11] Patent Number: 5,040,145

[45] Date of Patent: Aug. 13, 1991

[54] MEMORY CELL WITH ACTIVE WRITE LOAD

[75] Inventors: John E. Andersen, Lagrangeville; Robert L. Barry, Pleasant Valley, both of N.Y.; James N. Bisnett, San Antonio, Tex.; Eric G. Fung, Wappingers Falls, N.Y.

[73] Assignee: International Business Machines Corporation, Armonk, N.Y.

[21] Appl. No.: 505,952

[22] Filed: Apr. 6, 1990

[51] Int. Cl.$^5$ .............................................. G11C 11/40
[52] U.S. Cl. .................................... 365/154; 365/156; 365/190
[58] Field of Search ............... 365/154, 155, 156, 174, 365/179, 225.6

[56] References Cited

U.S. PATENT DOCUMENTS

| | | | |
|---|---|---|---|
| 3,643,235 | 2/1971 | Berger et al. | 365/156 |
| 3,725,879 | 4/1973 | Martin | 365/40 |
| 3,801,967 | 4/1974 | Berger et al. | 365/95 |
| 3,815,106 | 6/1974 | Wiedmann | 365/72 |
| 4,158,237 | 6/1979 | Wiedmann | 365/154 |
| 4,228,525 | 10/1980 | Kawarada et al. | 365/174 |
| 4,387,445 | 6/1983 | Denis et al. | 365/179 |
| 4,419,745 | 12/1983 | Toyoda et al. | 365/174 |
| 4,575,821 | 3/1986 | Eden et al. | 365/154 |
| 4,607,350 | 8/1986 | Scianna | 365/154 |
| 4,754,430 | 6/1988 | Hobbs | 365/155 |
| 4,782,467 | 11/1988 | Bett et al. | 365/154 |
| 4,783,765 | 11/1988 | Werner | 365/154 |
| 4,813,017 | 3/1989 | Wong | 365/156 |
| 4,858,181 | 8/1989 | Scharrer et al. | 365/155 |
| 4,922,455 | 5/1990 | Chin et al. | 365/154 |

FOREIGN PATENT DOCUMENTS 2034889 1/1979 Fed. Rep. of Germany .
491998 2/1976 U.S.S.R. .

OTHER PUBLICATIONS

J. A. Porter et al., "AC Write Scheme for BiPolar Random Access Memories Using Schottky Coupled Cells", IBM Technical Disclosure Bulletin, vol. 23, No. 11, Apr. 1981, pp. 4960-4962.

B. W. Martin et al., "Low Leakage Complementary Transistor Switch Cell", IBM Technical Disclosure Bulletin, vol. 26, No. 7A, Dec. 1983, pp. 3229-3230.

IBM Technical Disclosure Bulletin, vol. 10, No. 4, Sept. 1977 by J. R. Cavaliere et al., pp. 1447-1450.

IBM Technical Disclosure Bulletin, vol. 16, No. 12, May 1974 by H. H. Berger et al., pp. 3965-3967.

IBM Technical Disclosure Bulletin, vol. 16, No. 12, May 1974, by Berger et al., pp. 3963-3964.

IBM Technical Disclosure Bulletin, vol. 19, No. 1, June 1976 by J. E. Gersbach, p. 34.

IBM Technical Disclosure Bulletin, vol. 14, No. 6, Nov. 1972, by S. K. Wiedmann, pp. 1707-1708.

IBM Technical Disclosure Bulletin, vol. 14, No. 11, Apr. 1972 by H. H. Berger et al., pp. 3542-3543.

IBM Technical Disclosure Bulletin, vol. 14, No. 6, Nov. 1971, by J. J. McDowell, p. 1678.

Primary Examiner—Joseph A. Popek
Attorney, Agent, or Firm—Jeffrey L. Brandt

[57] ABSTRACT

A memory cell responsive to a write enable signal for storing write signals present on a pair of write bit lines and responsive to a read enable signal for presenting stored data on a pair of read sense lines further includes a timed, active write load. The memory cell includes first and second NPN bipolar transistors having commonly connected emitters, and cross-coupled bases and collectors; and first and second PNP bipolar transistors configured as loads for the pair of NPN bipolar transistors. Write transistors are provided responsive to the write enable signal for draining current from a selected one of the first or second nodes. Transistors connected as diodes between the PNP bases and each of the cross-coupled NPN nodes are responsive to the current draining effected by the write transistors for biasing both of the first and second PNP transistors into an active mode of operation.

15 Claims, 3 Drawing Sheets

MEMORY CELL WITH ACTIVE WRITE LOAD

RELATED APPLICATIONS

The present application is related to copending application Ser. No. 07/505,955, assigned to the assignee of the present application and filed concurrently herewith.

FIELD OF THE INVENTION

The present invention is directed generally to electronic circuits and more particularly to an electronic memory cell incorporating an active write load.

BACKGROUND OF THE INVENTION

One common type of memory cell includes a pair of NPN bipolar transistors arranged in a cross-coupled configuration for reading (i.e. storing) and writing a pair of binary data signals responsive to selected enable signals. In one configuration, such a memory cell includes a PNP transistor connected as a load to each of the cross-coupled transistors, and various read/write access transistors or buffering data into and out of the cell.

Such memory cells typically constitute a compromise of well-known operational parameters including, but not limited to: minimizing standby current and total current requirements, maximizing the speed of various read/write operations, and minimizing the likelihood of errors in the read/write data.

Many such memory cell configurations are known in the art, several of which are briefly referenced below.

J. R. Cavaliere et al., "Bipolar Random-Access Memory Cell with Bilateral NPN Bit Line Coupling Transistors", IBM Technical Disclosure Bulletin, Vol. 20, No. 4, September 1977, pages 1447–1450 shows several configurations of the above-described memory cell wherein PNP transistors are connected in the typical manner as passive load elements for the cross-coupled transistor pair.

U.S. Pat. No. 3,643,235 to Berger et al. (assigned to the assignee of the present invention) shows a similar memory cell (see particularly FIGS. 4 and 8) wherein the bias characteristics of the PNP load transistors are adjustable to control the supply of the current to the cross-coupled transistors. The Berger et al. circuits suffer from the disadvantage that the operation of the load transistors is synchronized to the operation of the bit lines in a manner that would tend to impede the rapid writing of the cell. Further, the load transistors in the FIG. 8 embodiment operate in a saturated mode that would tend to further impede the rapid operation of the cell.

U.S. Pat. 4,228,525 to Kawarada et al. shows a memory cell of the type described above, i.e. with cross-coupled NPN storage transistors having PNP loads, wherein the bases of the load transistors are connected to a bulk, buried word line. This circuit suffers from the disadvantage of having the load transistors operate in a relatively uncontrolled manner which is not optimal to the operation of the memory cell.

In this field of art, any memory cell which optimizes the desirable operating characteristics of a memory cell, such as fast, low power operation, while minimizing undesirable characteristics, such as soft error rates, represents a substantial contribution to the art.

OBJECTS OF THE INVENTION

The main object of the present invention is to provide a new and improved static memory cell.

Another object of the present invention is to provide such a memory cell wherein the write cycle time is very fast while the required current consumption and likelihood of error are low.

A further object of the present invention is to provide such a memory cell wherein the standby current is relatively low.

SUMMARY OF THE INVENTION

In accordance with the present invention, there is provided a new and improved memory cell responsive to a write enable signal for storing write signals present on a pair of write bit lines and responsive to a read enable signal for presenting stored data on a pair of read sense lines, comprising: first and second NPN bipolar transistors having commonly connected emitters, the base of the first NPN transistor connected to the collector of the second NPN transistor at a first node, the base of the second NPN transistor connected to the collector of the first NPN transistor at a second node; first and second PNP bipolar transistors configured as loads for the pair of NPN bipolar transistors, the first and second PNP bipolar transistors having commonly connected emitters and bases, the first PNP transistor having a collector connected to the first node, the second PNP transistor having a collector connected to the second node; means responsive to the write enable signal for draining current from a selected one of the first or second nodes; and means responsive to the current draining means for biasing both of the first and second PNP transistors into an active mode of operation; whereby the first and second PNP transistors are activated in a timed manner to provide current to the first and second NPN transistors after the current draining means has drained current from the selected one of the first and second nodes.

In accordance with another aspect of the present invention, there is provided a method of operating a memory cell responsive to a write enable signal for storing write signals present on a pair of write bit lines and responsive to a read enable signal for presenting stored data on a pair of read sense lines, the memory cell including first and second NPN bipolar transistors having commonly connected emitters, the base of the first NPN transistor connected to the collector of the second NPN transistor at a first node, the base of the second NPN transistor connected to the collector of the first NPN transistor at a second node; first and second PNP bipolar transistors configured as loads for the pair of NPN bipolar transistors, the first and second PNP bipolar transistors having commonly connected emitters and bases, the first PNP transistor having a collector connected to the first node, the second PNP transistor having a collector connected to the second node; the method including the steps of: draining current, responsive to the write enable signal, from a selected one of the first or second nodes; and biasing, responsive to the current draining step, both of the first and second PNP transistors into an active mode of operation; whereby the first and second PNP transistors are activated in a timed manner to provide current to the first and second NPN transistors after the current draining step has drained current from the selected one of the first and second nodes.

BRIEF DESCRIPTION OF THE DRAWINGS

These and other objects, features, and advantages of the present invention will become apparent from a consideration of the following detailed description of the invention when read in conjunction with the drawing Figures, in which.

DETAILED DESCRIPTION OF THE INVENTION

Figure 1:
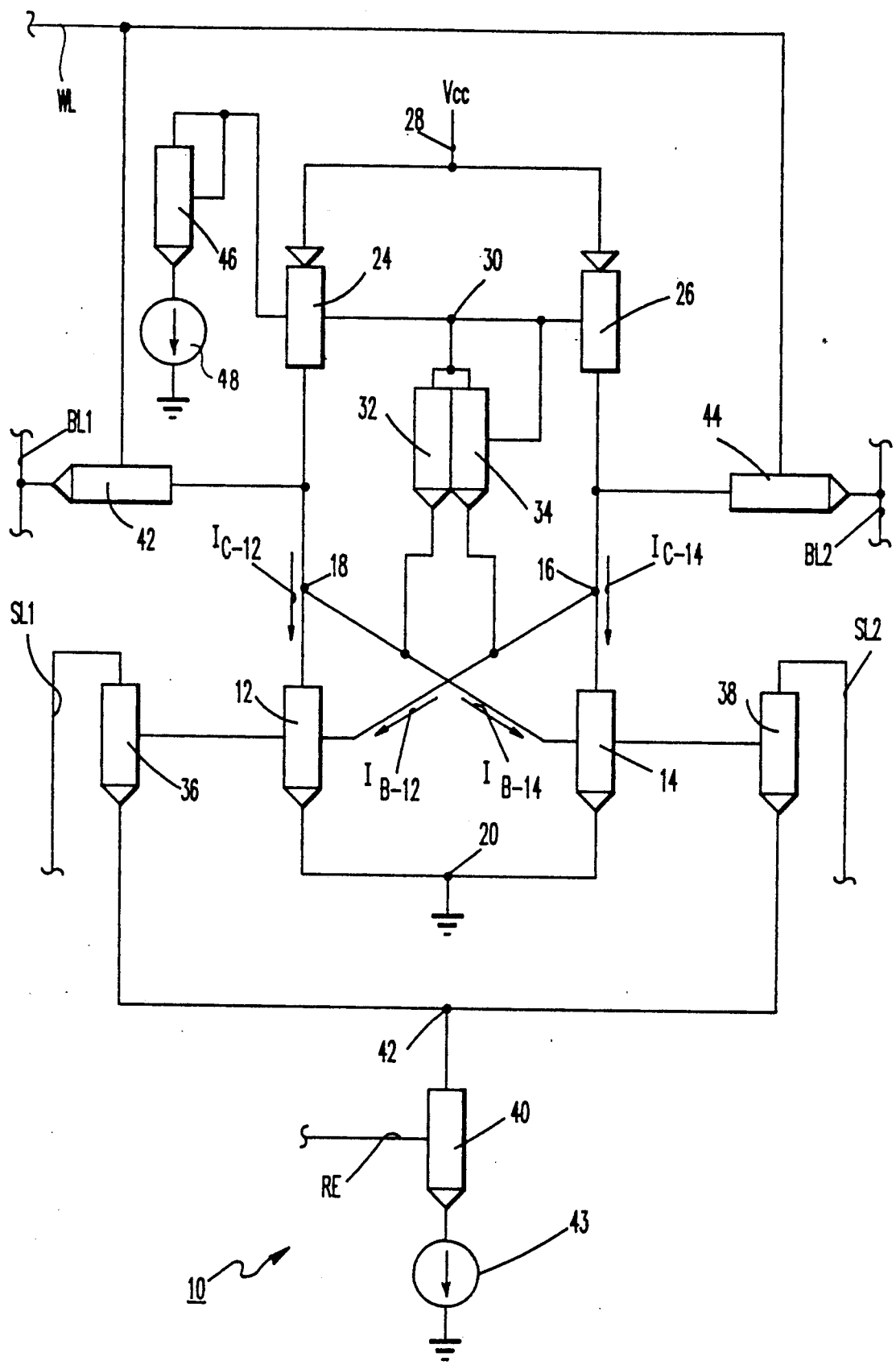
FIG. 1 is a circuit diagram of a memory cell constructed in accordance with the present invention.

Referring now to FIG. 1, a memory cell 10 constructed in accordance with the present invention includes a pair of NPN bipolar transistors 12, 14 connected in a cross-coupled, bi-stable configuration. More specifically, the base of transistor 12 is connected to the collector of transistor 14 at a node 16, while the base of transistor 14 is connected to the collector of transistor 12 at a node 18. The emitters of transistors 12, 14 are commonly connected at a circuit node 20, the node in turn being connected to ground.

A pair of PNP bipolar transistors 24, 26 are connected as loads for transistors 12, 14, respectively. More specifically, transistors 24, 26 have emitters connected in common at a circuit node 28, the node in turn being connected to a bias voltage $V_{CC}$. Transistors 24, 26 have bases connected in common at a circuit node 30. The collector of transistor 24 is connected to circuit node 18, while the collector of transistor 26 is connected to circuit node 16.

In accordance with one feature of the present invention, a pair of NPN bipolar transistors 32, 34 are connected as diodes with their bases and collectors connected in common at circuit node 30. Transistor 32 has its emitter connected to node 18, thus functioning as a diode between nodes 30 (anode connection) and 18 (cathode connection), while transistor 34 has an emitter connected to node 16, and similarly functions as a diode between nodes 30 (anode connection) and 16 (cathode connection).

Memory cell 10 includes three NPN bipolar transistors 36, 38, 40 connected for reading data stored in transistors 12, 14. More specifically, transistors 36, 38 include emitters connected in common at a circuit node 42. The base of transistor 36 is connected to the base of transistor 12, while the base of transistor 38 is connected to the base of transistor 14. Transistor 40 has a collector connected to circuit node 42, and an emitter connected through a current source 43 to ground. The collectors of transistors 36 and 38 function as separate read sense lines SL1 and SL2, respectively. The base of transistor 40 functions as a word read enable line RE.

As yet another feature of the present invention, memory cell 10 includes two NPN bipolar transistors 42, 44 connected for writing data into the cell. More specifically, transistor 42 has a collector connected at circuit node 18, while the collector of transistor 44 is connected at circuit node 16. The bases of transistors 42, 44 are connected in common to function as a word write enable line for receiving an externally generated word write enable signal WL, while the emitters of these two transistors function as write bit lines BL1 and BL2, respectively.

An NPN bipolar transistor 46 is connected as a diode, i.e. having commonly connected base and collector regions, with an anode at circuit node 30 and a cathode connected to a constant current source 48.

The operation of the memory cell of FIG. 1 will be described with respect to three distinct modes of operation: the standby mode, the write mode, and the read mode. These modes of operation will be described with further reference to FIGS. 2 and 3.

Figure 2:
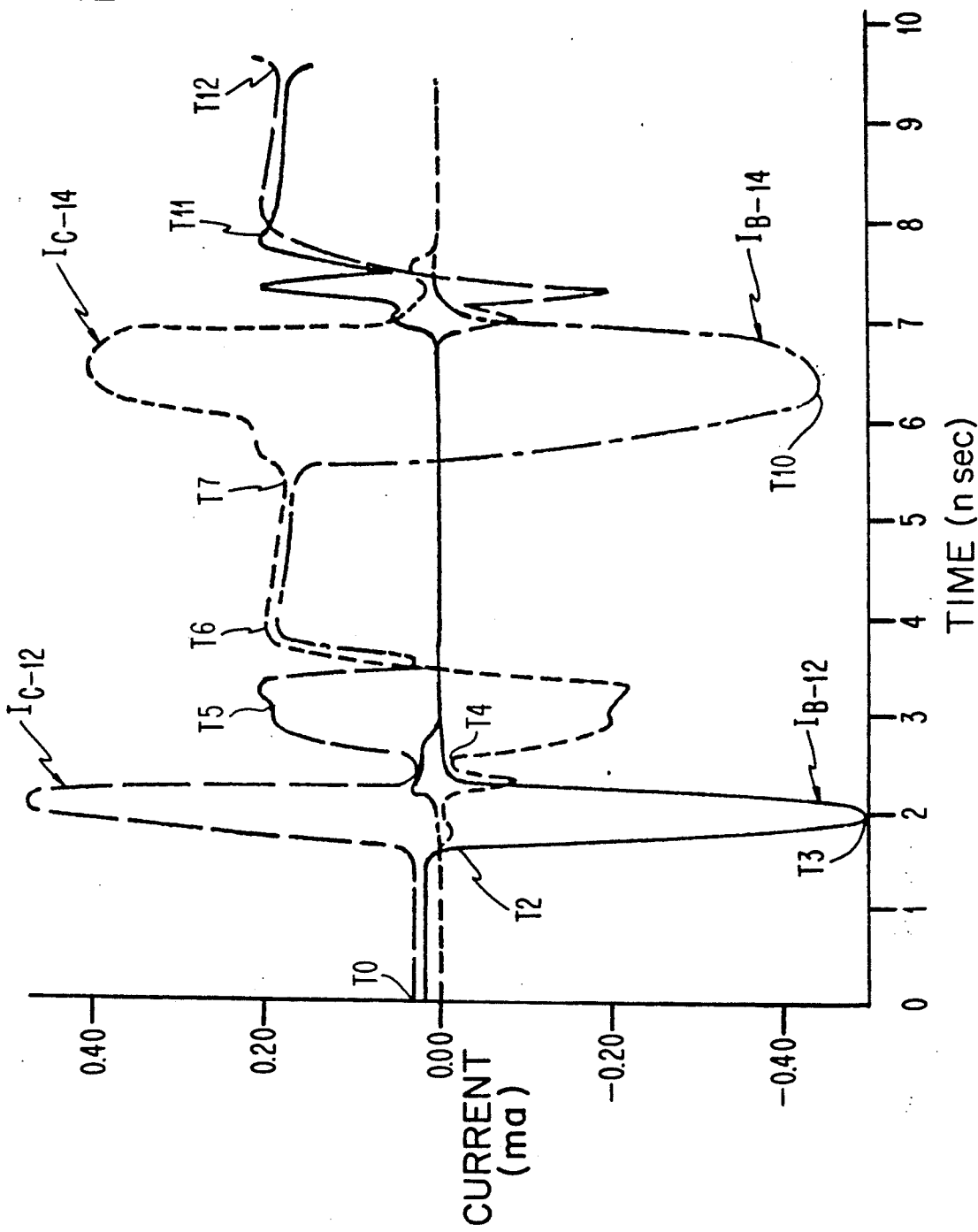
FIG. 2 is a graph showing the currents in selected legs of the circuit of FIG. 1 during two consecutive write operations.

FIG. 2 is a graph having a vertical scale of current in milliamps and a horizontal scale of time in nanoseconds. Plotted on this graph are base and collector currents of transistor 12: $I_{B-12}$ and $I_{C-12}$, respectively, and base and collector currents of transistor 14: $I_{B-14}$ and $I_{C-14}$, respectively.

Figure 3:
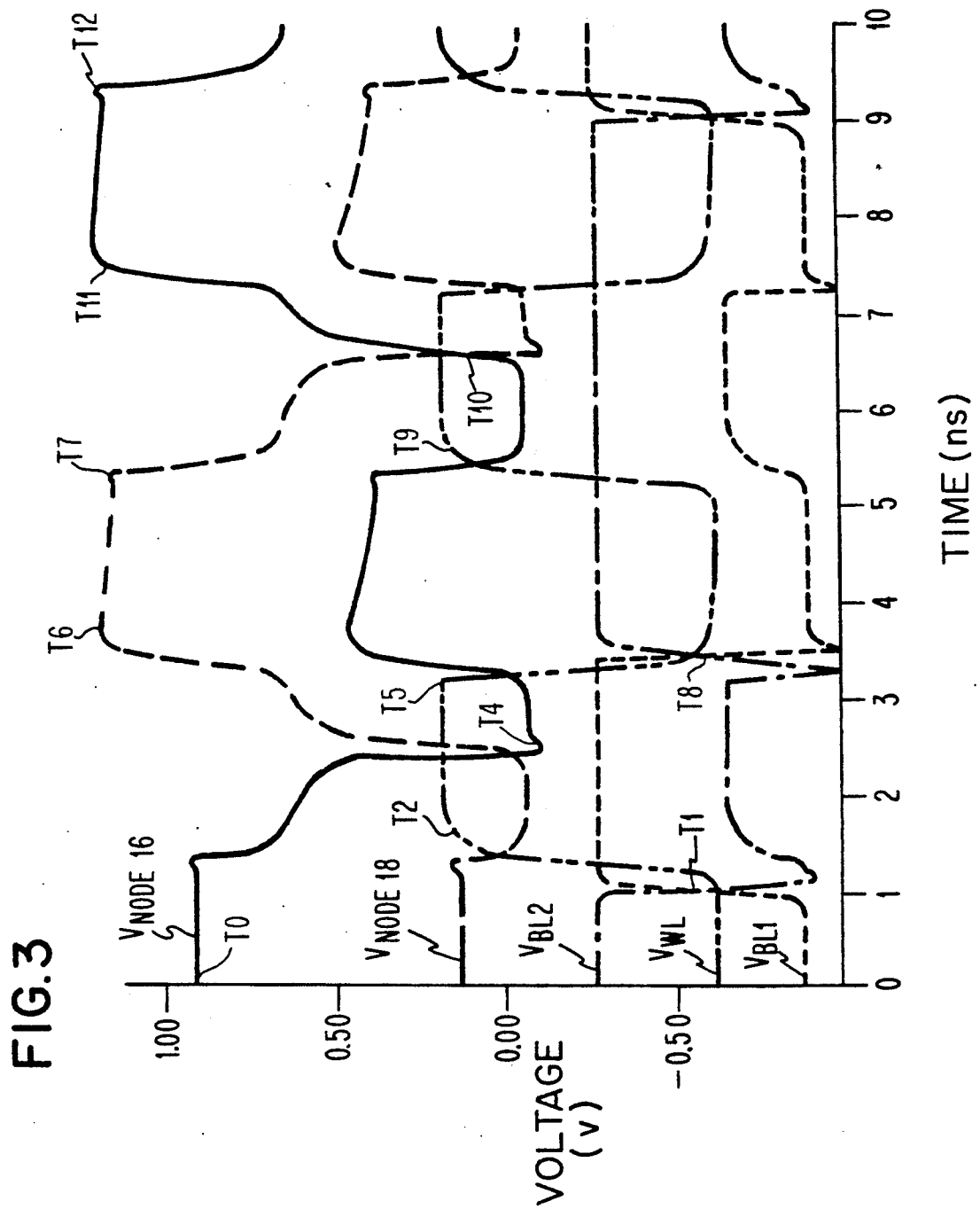
FIG. 3 a graph showing the voltages at selected nodes in the circuit of FIG. 1 during two consecutive write operations. The same horizontal time scale is used for both FIGS. 2 and 3.

FIG. 3 is a graph having a vertical scale in volts and a horizontal scale in nanoseconds. Plotted on this graph are voltages at circuit nodes 16 and 18: $V_{16}$ and $V_{18}$, respectively, voltages on bit lines BL1 and BL2: $V_{BL1}$ and $V_{BL2}$, respectively, and the voltage $V_{WL}$ on word line WL.

The time scales of the graphs of both FIGS. 2 and 3 are identical, representing the same two successive write cycles of memory cell 10. Where appropriate, references to activities at particular times will be indicated by like reference numbers on both FIGS. 2 and 3: i.e. TX, where X is a reference number.

Standby Mode of Operation

In the standby mode of operation, shown, for example, at time T0=0.0 ns, current source 48 pulls a small current through bias transistor 46. This provides a standby base current to load transistors 24 and 26 sufficient to maintain these transistors in a soft-on mode of operation (versus the hard-on mode effected during a write operation as described below). This operation of transistors 24 and 26 in turn maintains the ON transistor of the cross-coupled pair 12, 14 in saturation and with a saturated beta of approximately one (1) (i.e. with approximately equal amounts of current driven into the base and collector of the ON transistor 12 or 14). More specifically, with transistor 12 on, the collector current of transistor 12 is equal to the collector current of transistor 24, while the base current of transistor 12 equals the collector current of transistor 26. This saturated operation with a beta of one tends to inhibit the occurrence of soft errors in memory cell 10 during the standby mode of operation. The other transistor of cross-coupled pair 12, 14 is, of course, off.

Write Mode of Operation

Describing now the write mode of operation with respect to the first write cycle shown in FIGS. 2 and 3, at time T1=1.2 ns, the voltages $V_{BL1}$ and $V_{BL2}$ are set high and low, respectively, indicating the data to be stored in memory cell 10 responsive to the first write operation. At time T2=1.8 ns, the voltage on word write enable line WL is pulled high to select memory cell 10 from an array (not shown) of similar memory cells, enabling a write operation of memory cell 10. At this same time T2, current is sunk from circuit node 16 until the base current $I_{B-12}$ of transistor 12 reaches a peak negative current of −0.45 ma at a time T3=2 ns. This negative base current $I_{B-12}$ of transistor 12 results from the discharge of the collector-base capacitance developed during the saturated operation of transistor 12. At this same time T3, the currents supplied by transistors 24 and 26 are still relatively low, i.e. at the quiescent levels, and do not impede the discharge of node 16.

Between times T2 and a time T4=2.6 ns, the cell differential collapses. That is, the voltages at circuit nodes 16 and 18 reverse relative polarities. At time T4, in accordance with the present invention, transistor 34 functions to clamp the voltage of node 16 at about −0.1 volts, preventing write transistor 44 from going into saturation. As transistor 34 turns on in a clamping action, it provides base current to transistors 24 and 26, powering them up to a hard-ON mode of operation, providing rapid increases in the voltage at node 18 and the base current of transistor 14, $I_{B-14}$. Both of these changes are apparent during the time interval between T4 and a time T5=3.1 ns. During this interval between T4 and T5, write current drawn by the collector of transistor 44 and not supplied by transistors 26 and 34 is supplied by a temporary inversion of transistor 14. The large base current supplied to transistor 14 places the transistor in a saturated mode of operation, hence developing a relatively large charge at node 18.

The charge stored at node 18 is retained as the operation of transistor 12 undergoes a transition from the inverted mode of operation into a forward mode of operation. This transition occurs while the write word enable signal WL is brought low during the time interval between time T5 and a time T6=3.9 ns.

During the time interval between time T6 and a time T7=5.2 ns, memory cell 10 is in the process of stabilizing back to the standby operation indicated at time T0 (for transistor 12 in the saturated mode). The speed with which this stabilization occurs is dependent on the relatively slow decay of current in PNP load transistors 24 and 26 to their quiescent (or soft-ON) mode of operation. It is noted that the base and collector currents of transistor 14, $I_{B-14}$ and $I_{C-14}$, respectively, are never exactly equal in the standby mode, due to the Early Effect in the operation of transistors 24 and 26.

Important features of the present invention are that the load transistors 24 and 26 are always operated in an ON, unsaturated mode of operation (hard-ON during a write operation, and soft-ON in the standby mode), while one of cross-coupled transistor pair 12 and 14 is always operated in a saturated mode.

During the time interval from about T7 to a time T11=7.3 ns as shown in FIGS. 2 and 3, a substantially identical write operation is executed. This second write operation uses opposite polarity data and begins at a higher initial power condition (i.e. with a higher charge on node 18). Hence, this second write operation takes slightly longer to execute than does the first, above-described write operation.

Briefly, the data $V_{BL1}$, $V_{BL2}$ on bit lines BL1, B12 is reversed at time T8=3.5 ns (while the write enable signal $V_{WL}$ is low). At time T9=5.6 ns, write enable signal $V_{WL}$ is brought high. The base current $I_{B-14}$ of transistor 14 reaches a peak negative current time the voltages $V_{node}$ 16 and $V_{node}$ 18, on nodes 16, 18, cross, i.e. go high and low, respectively. The data is written into cell 10 during the interval between about 6 and 7 ns, and by time T11=7.2 ns the cell is restored to a standby mode of operation during which the beta of transistor 12 is approximately equal to one (1).

Many of the advantages of the present invention are realized in this write mode of operation. More specifically, the above-described clamping action of transistors 32, 34 prevents the loading down of word enable write line WL (by preventing saturation of transistors 42 and 44), permitting faster subsequent write operations. Maintaining the ON transistor in the cross-coupled pair 12, 14 in a saturated mode tends to inhibit the occurrence of soft errors, while The maintenance of the load transistors 24, 26 in an ON/unsaturated mode provides extremely fast write response. Further, because PNP load transistors 24, 26 exhibit, in their inherent operation, a slower switching frequency than do NPN's, the write enable signal applied to line WL can be terminated quickly, with the load transistors remaining ON so as to reinforce the written data. This operation of PNP load transistors 24, 26 further functions to rapidly restore cell 10 form inversion to the stable, standby mode of operation (seen in the time intervals 0 ns–T1, T6–T7, and T11–T12) described herein below. This last advantage is apparent in FIG. 3, wherein it is seen that the transitions from the write-to-standby modes of operation (i.e. the time intervals T5–T6, and 7–7.5 ns) are quite rapid: i.e. on the order of 0.5 ns.

Read Mode of Operation

In the read mode of operation, the word enable read line RE is pulled to a high voltage, turning transistor 40 on. Transistor 40, functioning as a current source, then steers current selectively through transistors 36, or 36, depending on the state of transistors 12, 14. If transistor 12 is ON (and transistor 14 is OFF), current will be steered through transistor 36. Alternatively, if transistor 14 is ON (and transistor 12 is OFF), current is steered through transistor 38. The base currents of transistors 36, 38 are supplied by transistors 26, 24, respectively. Conventional sense amplifiers (not shown) connected to sense lines SL1 and SL2 (i.e. the collectors of transistors 36, 38, respectively) are used to sense the state of memory cell 10. The status of transistors 12, 14 is unaffected by this read operation.

There is thus provided a new and improved memory cell 10 which, responsive to the initiation of a write operation, operates with self-timed, self-controlled power-up of PNP load transistors 24, 26. The ON one of cross-coupled NPN storage transistors 12, 14 is maintained in a controlled and limited saturation during write, read, and standby operations. The cell requires only a minimal standby current, which is provided in a well-regulated manner. The memory cell further exhibits the desirable characteristics of fast read and write cycle bandwidths, low power requirements, multi-port connectability, and resistance to soft errors.

The present invention has application in the fabrication of memory arrays for computing systems, and particularly for general register and cache memory systems (e.g. directories and DLATS).

While the present invention has been shown and described with respect to a preferred embodiment, it will be understood that it is not thus limited. Numerous modifications, changes, and improvements, falling within the spirit and scope of the present invention will occur to those skilled in the art.

What is claimed is:

1. A memory cell responsive to a write enable signal for storing write signals present on a pair of write bit lines and responsive to a read enable signal for presenting stored data on a pair of read sense lines, comprising:

first and second NPN bipolar transistors having commonly connected emitters, a base of said first NPN transistors connected to a collector of said second NPN transistor at a first node, a base of said second NPN transistor connected to a collector of said first NPN transistor at a second node;

first and second PNP bipolar transistors configured as loads for said first and second NPN bipolar transistors, said first and second PNP bipolar transistors having commonly connected emitters and bases, said first PNP transistor having a collector connected to said first node, said second PNP transistor having a collector connected to said second node;

means responsive to said write enable signal for draining current from a selected one of said first and second nodes; and means responsive to said current draining means for biasing both of said first and second PNP transistors into an active mode of operation;

whereby said first and second PNP transistors are activated in a timed manner to provide current to said first and second NPN transistors after said current draining means has drained current from said selected one of said first and second nodes.

2. A memory cell in accordance with claim 1 and further including means for maintaining a selected one of said first and second NPN transistors in a saturated mode of operation at substantially all times during the operation of said memory cell.

3. A memory cell in accordance with claim 1 and further including means for maintaining both of said first and second PNP transistors in an ON mode of operation at substantially all times during the operation of said memory cell, said biasing means functioning to bias said first and second PNP transistors into a hard ON mode of operation during a write operation.

4. A memory cell in accordance with claim 3 wherein said means for maintaining both of said first and second PNP transistors in an ON mode of operation includes a constant current source connected to the bases of said first and second PNP transistors.

5. A memory cell in accordance with claim 1 wherein said biasing means includes:

first means connected intermediate said commonly connected bases of said first and second PNP transistors and said first node of sinking current from the bases of said first and second PNP transistors when said first node is at a logical low signal level; and second means connected intermediate said commonly connected bases of said first and second PNP transistors and said second node for sinking current from the bases of said first and second PNP transistors when said second node is at a logical low signal level;

whereby to supply substantially equal currents to both the base and collector of a selected one of said first and second NPN transistors during said write cycle.

6. A memory cell in accordance with claim 5 wherein:

said first current sinking means includes a diode having an anode connected to the commonly connected bases of said first and second PNP transistors and a cathode connected to said first node; and said second current sinking means includes a diode having an anode connected to the commonly connected bases of said first and second PNP transistors and a cathode connected to said second node.

7. A memory cell responsive to a write enable signal for storing write signals present on a pair of write bit lines and responsive to a read enable signal for presenting stored data on a pair of read sense lines, comprising:

first and second NPN bipolar transistors having commonly connected emitters, a base of said first NPN transistor connected to a collector of said second NPN transistor at a first node, a base of said second NPN transistor connected to a collector of said first NPN transistor at a second node;

first and second PNP bipolar transistors configured as loads for said first and second NPN bipolar transistors, said first and second PNP bipolar transistors having commonly connected emitters and bases, said first PNP transistor having a collector connected to said first node, said second PNP transistor having a collector connected to said second node;

means responsive to said write enable signal for draining current from a selected one of said first and second nodes;

a first diode having an anode connected to the commonly connected bases of said first and second PNP transistors and a cathode connected to said first node; and a second diode having an anode connected to the commonly connected bases of said first and second PNP transistors and a cathode connected to said second node.

8. A memory cell in accordance with claim 7 wherein said current draining means comprises:

a first NPN bipolar write transistor having a base, emitter, and collector, with the collector connected to said first node;

a second NPN bipolar write transistor having a base, emitter, and collector, with the collector connected to said second node;

the bases of said first and second write transistors commonly connected to receive said write enable signal, and the emitters of said first and second write transistors respectively connected to receive said write signals.

9. A memory cell in accordance with claim 7 and further including a constant current source connected to the bases of said first and second PNP transistors.

10. A method of operating a memory cell responsive to a write enable signal for storing write signals present on a pair of write bit lines and responsive to a read enable signal for presenting stored data on a pair of read sense lines, said memory cell including first and second NPN bipolar transistors having commonly connected emitters, a base of said first NPN transistor connected to a collector of said second NPN transistor at a first node, a base of said second NPN transistor connected to a collector of said first NPN transistor at a second node; first and second PNP bipolar transistors configured as loads for said first and second NPN bipolar transistors, said first and second PNP bipolar transistors having commonly connected emitters and bases, said first PNP transistor having a collector connected to said first node, said second PNP transistor having a collector connected to said second node; said method including the steps of:

draining current, responsive to said write enable signal, from a selected one of said first and second nodes; and biasing, responsive to said current draining step, both of said first and second PNP transistors into an active mode of operation;

whereby said first and second PNP transistors are activated in a timed manner to provide current to said first and second NPN transistors after said current draining step has drained current from said selected one of said first and second nodes.

11. A method in accordance with claim 10 and further including the step of maintaining a selected one of said first and second of NPN transistors in a saturated mode of operation at substantially all times during the operation of said memory cell.

12. A method in accordance with claim 10 and further including the step of maintaining both of said first and second PNP transistors in an ON mode of operation at substantially all times during the operation of said memory cell, said biasing step functioning to bias said first and second PNP transistors into a hard ON mode of operation during the write operation.

13. A method in accordance with claim 12 wherein said step of maintaining both of said first and second PNP transistors in an ON mode of operation includes utilizing a constant current source connected to the bases of said first and second PNP transistors.

14. A method in accordance with claim 10 wherein said biasing step includes utilizing:

first means connected intermediate said commonly connected bases of said first and second PNP transistors and said first node for sinking current from the bases of said first and second PNP transistors when said first node goes to a logical low signal level; and second means connected intermediate said commonly connected bases of said first and second PNP transistors and said second node for sinking current from the bases of said first and second PNP transistors when said second node goes to a logical low signal level;

whereby to supply substantially equal currents to both the base and collector of a selected one of said first and second NPN transistors during said write cycle.

15. A method in accordance with claim 14 wherein:

said first current sinking means includes a diode having an anode connected to the commonly connected bases of said first and second PNP transistors and a cathode connected to said first node; and said second current sinking means includes a diode having an anode connected to the commonly connected bases of said first and second PNP transistors and a cathode connected to said second node.

* * * * *